United States Patent
Chang et al.

(10) Patent No.: US 7,474,788 B2
(45) Date of Patent: Jan. 6, 2009

(54) METHOD AND SYSTEM FOR ENHANCING IMAGE RESOLUTION USING A MODIFICATION VECTOR

(75) Inventors: Shih-Ming Chang, Hsinchu (TW); Wen-Chuan Wang, Tainan (TW); Jan-Wen You, Jhongli (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 874 days.

(21) Appl. No.: 10/935,904

(22) Filed: Sep. 8, 2004

(65) Prior Publication Data

US 2006/0050965 A1    Mar. 9, 2006

(51) Int. Cl.
*G06K 9/48* (2006.01)
(52) U.S. Cl. .............. 382/199; 382/128; 382/132; 382/142; 382/195; 382/268; 382/269; 382/275; 382/242; 382/107; 382/212; 358/1.1; 358/1.9
(58) Field of Classification Search .......... 382/128, 382/142, 199, 269, 268, 261, 266, 242, 132, 382/270, 195, 299, 107, 239, 264, 275, 212; 358/1.1, 1.9; 716/19; 356/400, 401
See application file for complete search history.

(56) References Cited

U.S. PATENT DOCUMENTS

| | | | | |
|---|---|---|---|---|
| 5,515,453 A * | 5/1996 | Hennessey et al. | ........ | 382/141 |
| 5,719,967 A * | 2/1998 | Sekine | ........ | 382/266 |
| 5,878,161 A * | 3/1999 | Ishida et al. | ........ | 382/198 |
| 6,011,531 A * | 1/2000 | Mei et al. | ........ | 345/92 |
| 6,023,535 A * | 2/2000 | Aoki | ........ | 382/299 |
| 6,608,932 B1 * | 8/2003 | Rasmussen et al. | ........ | 382/195 |
| 6,621,924 B1 * | 9/2003 | Ogino et al. | ........ | 382/165 |
| 6,980,688 B2 * | 12/2005 | Wilk | ........ | 382/152 |
| 7,003,177 B1 * | 2/2006 | Mendlovic et al. | ........ | 382/299 |
| 7,117,475 B2 * | 10/2006 | Croffie | ........ | 716/19 |
| 7,139,416 B2 * | 11/2006 | Vuylsteke | ........ | 382/128 |
| 7,272,265 B2 * | 9/2007 | Kouri et al. | ........ | 382/260 |
| 2006/0050965 A1 * | 3/2006 | Chang et al. | ........ | 382/199 |

* cited by examiner

*Primary Examiner*—Samir A. Ahmed
*Assistant Examiner*—Nancy Bitar
(74) *Attorney, Agent, or Firm*—Thomas, Kayden, Horstemeyer & Risley

(57) ABSTRACT

An image processing system. An input/output device receives information for pixels in an image corresponding to an object, wherein the information specifies optical properties. A storage device stores the information. A processor determines an image of preliminary contour of the object based on the information. For pixels located on the preliminary contour are assigned as primary pixels, wherein anchor points determined by the location of the primary pixels, and the reference pixels determine modification vectors according to the information corresponding to the primary and reference pixels, and adjusts the positions of the anchor points according to the modification vectors. These processes are applied on every pixels or selected pixels located on the preliminary contour repeatedly to determine the final modified contour with sub-pixel accuracy.

36 Claims, 10 Drawing Sheets

METHOD AND SYSTEM FOR ENHANCING IMAGE RESOLUTION USING A MODIFICATION VECTOR

BACKGROUND

The present invention relates to image processing, and in particular, to an image processing system and method enhancing image resolution and generating sub-pixel accuracy on images captured by metrology tools.

Conventionally, images obtained from a metrology tool, such as a scanning electron microscope (SEM), are used only for critical dimension (CD) measurement. Limits to application of the SEM images are due to insufficient resolution of resulting images processed by conventional methods distinguishing pixels corresponding to background and inspected object using local or global threshold filtering on optical property such as the intensity. The resolution is limited by the size of pixels represented in the images obtained thereby. For example, an image containing 500×500 pixels with a 10 µm field-of-view has a pixel representing size of 20 nm. Thus, a single pixel deviation results in a 20 nm-difference in resolution with metrology analysis.

As shown in FIG. 1, an object 10 is inspected and a SEM image 13 obtained therefrom. A contour of the object on the image is determined according to intensity information of pixels in the image. The grey-level SEM image is digitalized using threshold filtering according to a preset intensity or slope threshold. Thus, pixels corresponding to intensity values greater than the preset threshold are assigned a digitalized intensity value as 1, otherwise zero. For example, a digitalized image 15 has a rough contour as shown in FIG. 1. Because of the current incomplete image processing, applications other CD related measurement are difficult to achieve, such as measurements for line edge roughness, corner rounding, and other characteristics of the inspected object.

Hence, there is a need for an image processing system and method at the sub-pixel level providing enhance image resolution from metrology tools.

SUMMARY

Accordingly, an object of the invention is to provide an image processing system and method enhancing image resolution for a metrology tool.

An embodiment of the present invention provides an image processing method using information of pixels to enhance the resolution of an image to sub-pixel level. First, information is provided, pertaining to pixels in an image corresponding to an object, the information specifying an optical property. Then an image of the preliminary contour of the object is determined based on the information. Next, for each pixel located on the preliminary contour, the primary and the reference pixel(s) are assigned, wherein the center of the primary pixel is an anchor point of the preliminary contour of the object and the reference pixel(s) is(/are) adjacent to the primary pixel. Then a modification vector is determined according to the information corresponding to the primary and reference pixel(s). Then the position of the anchor point is adjusted according to the modification vector. These processes are applied on every pixels or selected pixels located on the preliminary contour repeatedly to determine the final modified contour.

Embodiments of invention also provide an information processing system. The information processing system comprises an input/output device, a storage device, and a processor.

The input/output device receives information for pixels in an image corresponding to an object, wherein the information specifies an optical property. The storage device stores the information. The processor determines an image contour of the object based on the information, assigns the primary and the reference pixel(s) from the image of preliminary contour, wherein the center of the primary pixel is an anchor point of the preliminary contour of the object and the reference pixel(s) is(/are) adjacent to the primary pixel, determines a modification vector according to the information corresponding to the primary and reference pixels, and adjusts the position of the anchor point according to the modification vector. These processes are applied on every pixels or selected pixels located on the preliminary contour repeatedly to determine the final modified contour.

The above-mentioned method may take the form of program code embodied in a tangible media. When the program code is loaded into and executed by a machine, the machine becomes an apparatus for practicing embodiments of the invention.

A detailed description is given in the following embodiments with reference to the accompanying drawings.

BRIEF DESCRIPTION OF THE DRAWINGS

Embodiments of the present invention can be more fully understood by reading the subsequent detailed description and examples with references made to the accompanying drawings, wherein.

DETAILED DESCRIPTION OF THE INVENTION

Embodiments of the present invention will now be described with reference to FIGS. 2 to 6, which in general relate to an image processing system. While embodiments disclosed operate with optical property obtained from a metrology tool, such as a Scanning Electron Microscopy (SEM), it is understood that the source of optical information is not critical to the present invention, and any system performing information processing may operate with the present invention. For example, the information of altitude of an object obtained from an Atomic Force Microscopy (AFM), can be considered as another type of image process which is also suitable for this invention.

Figure 1:
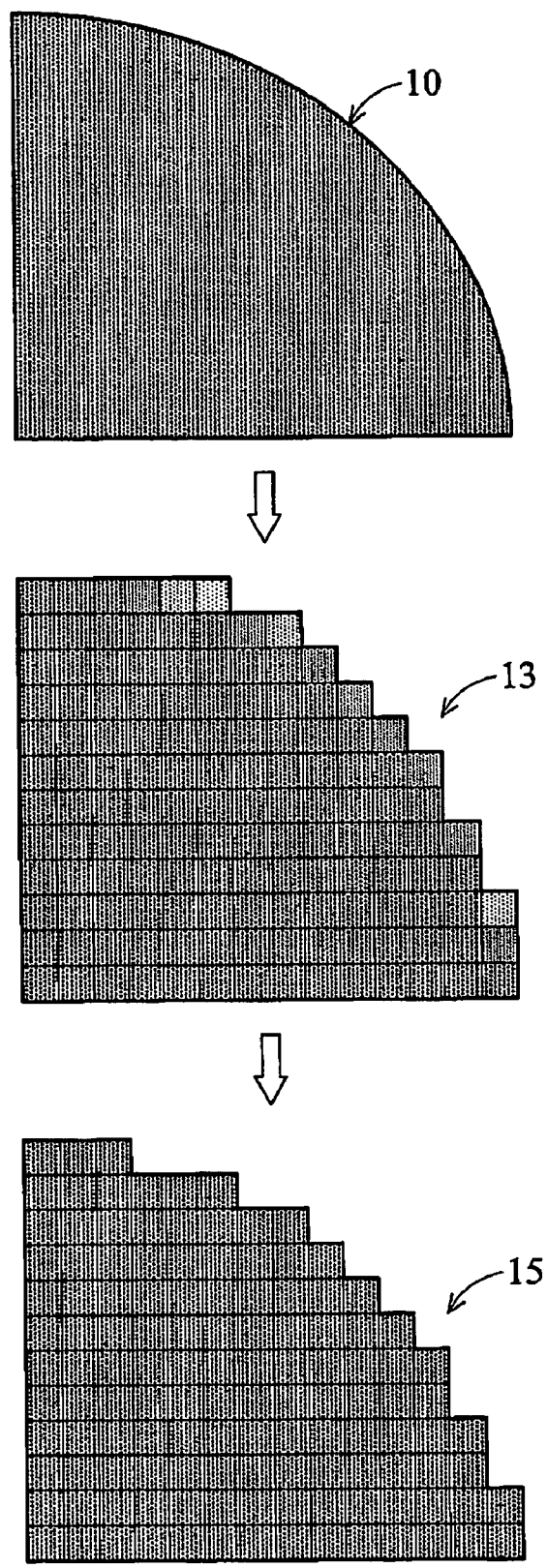
FIG. 1 is a schematic view of contour determination according to a conventional image processing method.
Figure 2:
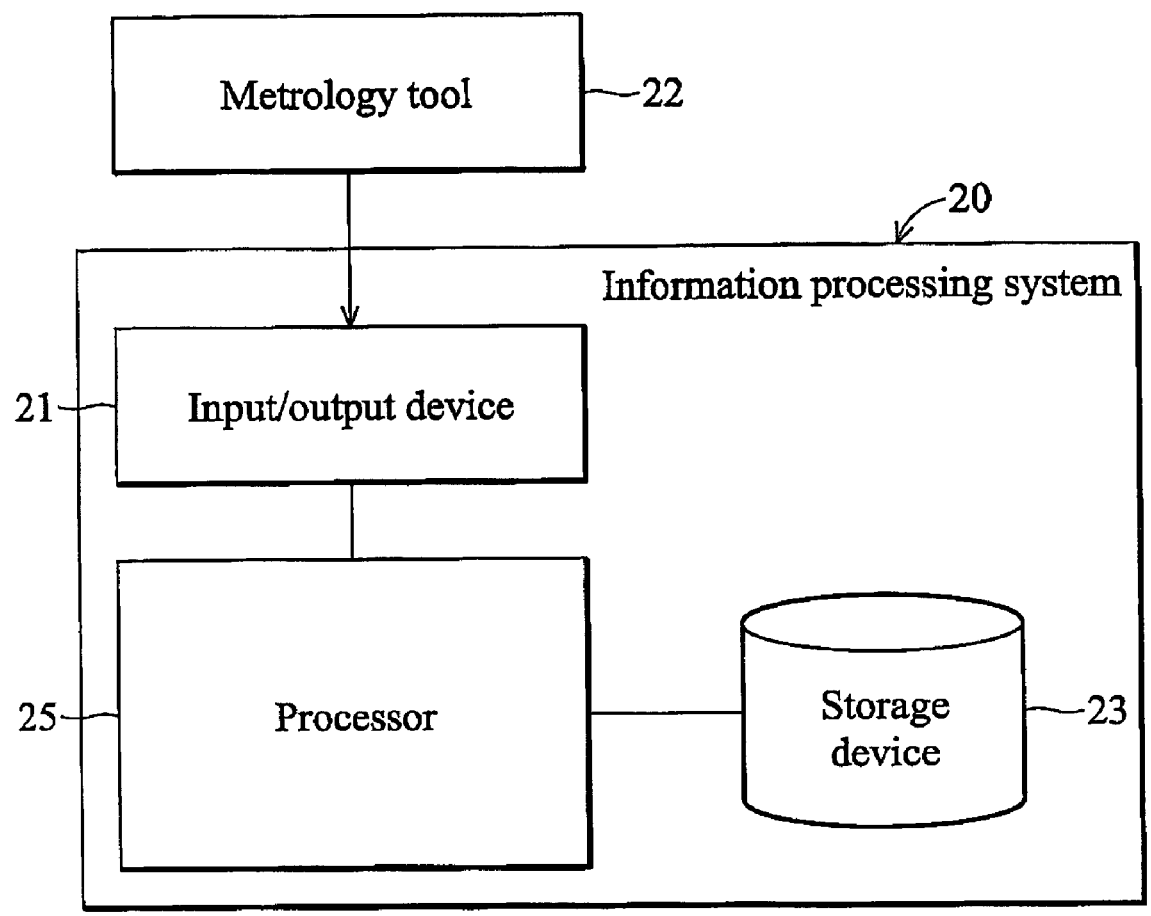
FIG. 2 is a schematic view of an image processing system according to embodiments of the present invention.

FIG. 2 is a schematic view of an image processing system according to embodiments of the present invention. An image processing system 20, connected to a metrology tool 22, comprises an input/output device 21, a storage device 23, and processor 25. The metrology tool 22 inspects an object to obtain information thereof, wherein the information specifies an optical property of pixels in an image for the object. The input/output device 21 receives the optical information. The processor 25 retrieves the optical information from the storage device 23, determines an image contour of the object based on the optical information, and assigns the primary and the reference pixel(s) from the image contour of the object, wherein the center of the primary pixel is an anchor point of the image contour of the object and the reference pixel(s) is(/are) adjacent to the primary pixel, determines a modification vector according to the optical information corresponding to the primary and the reference pixel(s), and adjusts the position of the anchor point according to the modification vector. The aforementioned optical property can be any optical property obtained from a metrology tool, such as intensity, phase, and polarization. The contour determination can be accomplished by any known method, such as local threshold filtering, fixed global threshold filtering, and floating global threshold filtering. Correspondence between the primary pixel and reference pixel(s) can be designed to meet requirements. For example, one primary pixel can correspond to 1, 2, 8, or 24 reference pixel(s).

Figure 3:
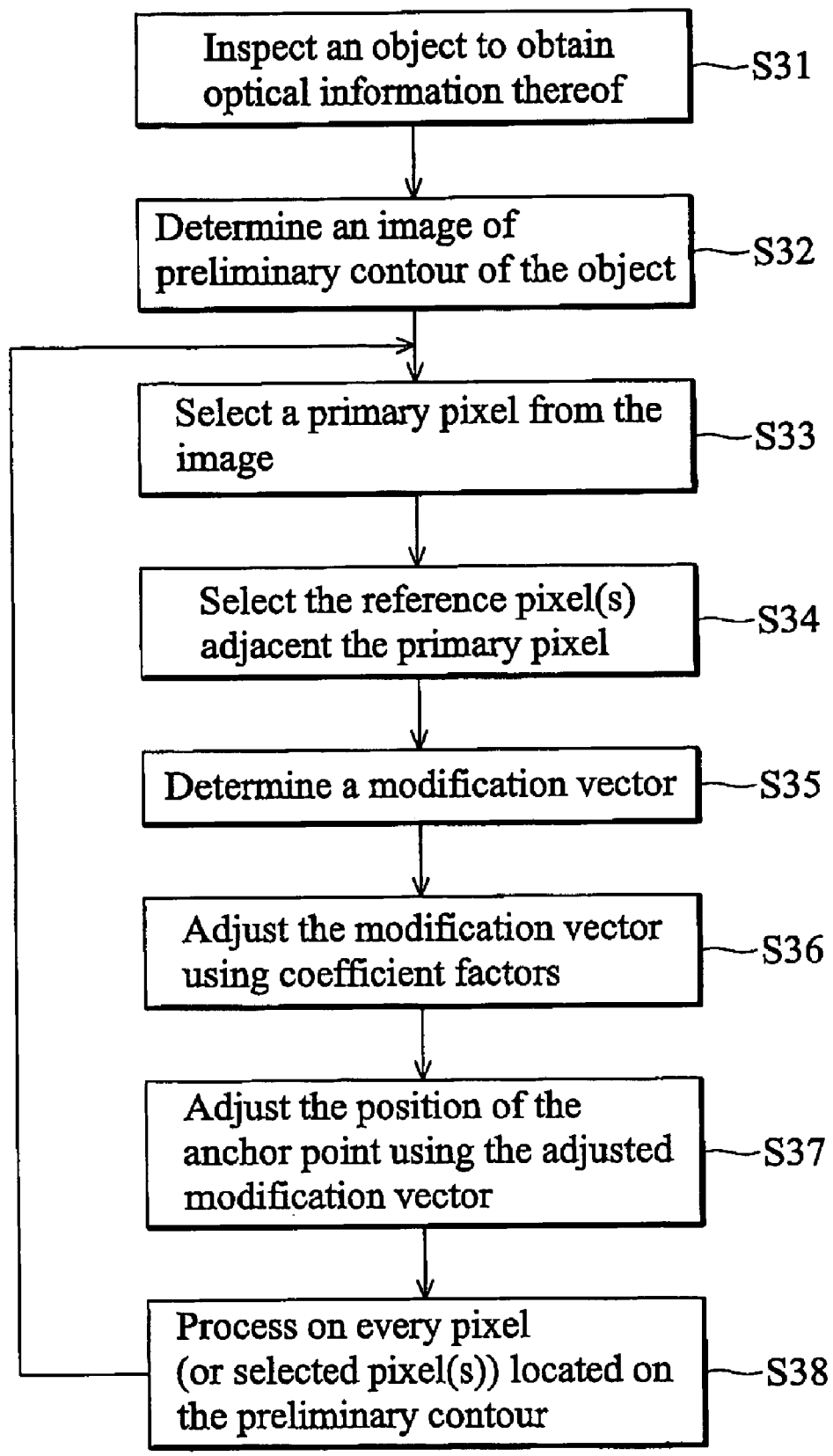
FIG. 3 is a flowchart of the image processing method according to embodiments of the present invention.

FIG. 3 is a flowchart showing the image processing method according to embodiments of the invention.

In step S31, an object is inspected to obtain information specifying an optical property of pixels in an image for the object, the optical property obtained from a metrology tool, such as, for example, intensity, phase, or polarization.

In step S32, an image of preliminary contour of the object is determined according to the optical properties. The contour determination can be accomplished by any known method, such as local threshold filtering, fixed global threshold filtering, or floating global threshold filtering.

A primary pixel is then selected from the image (step S33), and the reference pixels selected accordingly (step S34). The location of a primary pixel determines the location of a corresponding anchor point of the image of preliminary contour and the reference pixel(s) is(/are) adjacent thereto. Correspondence between the primary pixel and reference pixel(s) can be designed to meet requirements. For example, one primary pixel can correspond to 1, 2, 8, or 24 reference pixel(s).

A modification vector is then determined according to the optical properties corresponding to the primary and the reference pixel(s) (step S35). The modification vector is further adjusted by a plurality of coefficient factors determined experimentally (step S36). According to embodiments of the present invention, the coefficient factors comprise a local gradient coefficient, a diagonal coefficient, and a boundary shifting coefficient. In step S37, position of the anchor point is adjusted according to the adjusted modification vector. The processes from S33 to S37 will be repeatedly applied on selected pixels located on the image of the preliminary contour.

Figure 4:
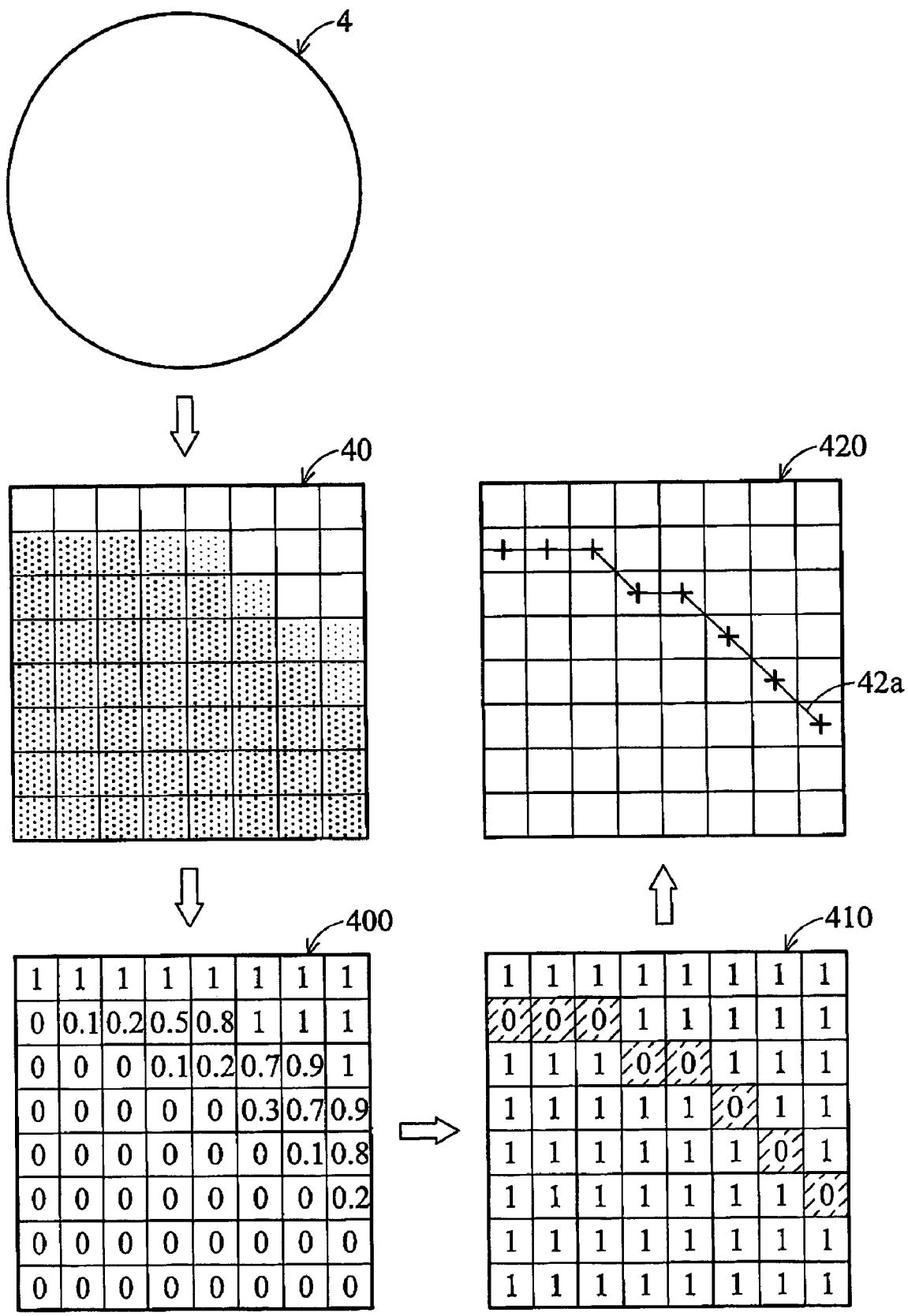
FIG. 4 illustrates contour determination according to the first embodiment of the present invention.

In FIG. 4, illustrating the first embodiment of the invention, an object 4 with a smooth contour is inspected by a scanning electron microscope (SEM). An image of the object 4 is formed by scanning electron beams across the object 4 to collect information, such as intensity, from the beam-object interaction. A grey level original image 40 is then formed based on the information, as shown in FIG. 4, wherein only partial image is shown. A block 400 shows intensity values for each of the pixels in the image 40. The intensity values in the block 400 are then processed to extract edge pixels of the image. A block 410 shows binary values for the pixels in the block 400 after the edge extraction process. Shadowed pixels in the block 410 are preliminary contour pixels of the image depicting the preliminary contour thereof. In this case, the center point of each preliminary contour pixel in the block 410 is marked as an anchor point of the preliminary contour of the image, as illustrated in block 420. The pixel-based image 40 is now transformed into vector-based format. Modification vectors for every anchor points are then determined to smooth the rough preliminary contour 42a.

Figure 5:
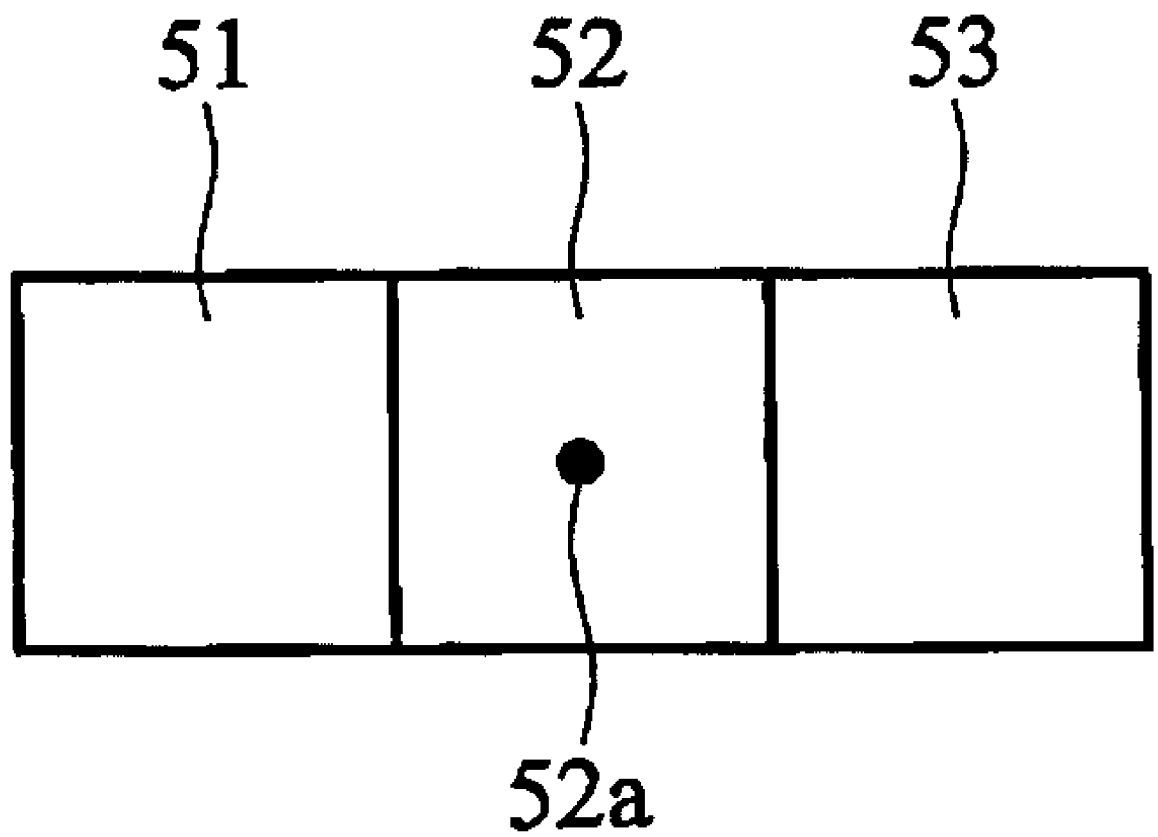
FIG. 5 illustrates contour determination according to the second embodiment of the present invention.

For each anchor point corresponding to its primary pixel, the modification vector is calculated using information corresponding to at least one reference pixel adjacent to a primary pixel of the preliminary contour. According to the first embodiment, the information specifies optical intensity of a pixel on the preliminary contour, and two adjacent pixels are referenced. FIG. 5 shows pixels 51, 52, and 53, wherein pixel 52 is a primary pixel having a center point 52a as an anchor point of the preliminary contour. A modification vector is used for adjusting position of an anchor point. The modification vector is determined according to intensity values for pixels 51, 52, and 53. The magnitude of the modification vector is calculated as $[I_C-(I_L+I_R)/2]$, wherein $I_C$, $I_L$, and $I_R$ are intensity values for pixels 52, 51, and 53, respectively. When the $[I_C-(I_L+I_R)/2]$ is positive, the modification vector directs rightward, and specifying a displacement for the anchor point, shifts the anchor point rightward accordingly. For example, when the intensity values of pixels 51, 52, and 53 are 1, 0, and 0, the magnitude of the modification vector is (0.5), and the modification vector directs leftward, with the anchor point shifting leftward by 0.5 pixel-width. For example, when the intensity values of pixels 51, 52, and 53 are 1, 0.75, and 0, the magnitude of the modification vector is (0.25), and the modification vector directs rightward. The anchor point is shifted rightward by a quarter(0.25) of a pixel-width. When the intensity values of pixels 51, 52, and 53 are 1, 0.5, and 0, the modification vector is 0. Thus the anchor point remains in its original position without shifting.

Figures 6A, 6B:
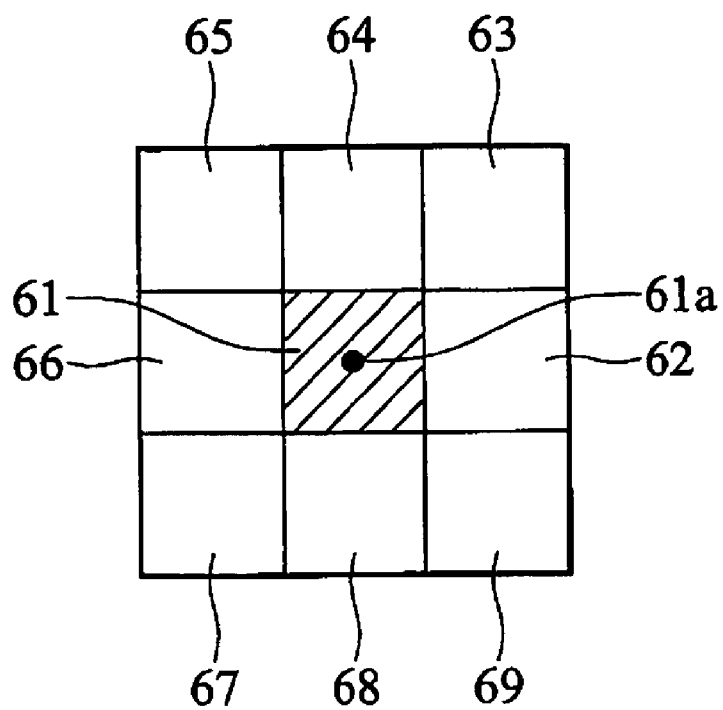
FIGS. 6A~6C illustrate contour determination according to a third embodiment of the present invention.
Figure 6C:
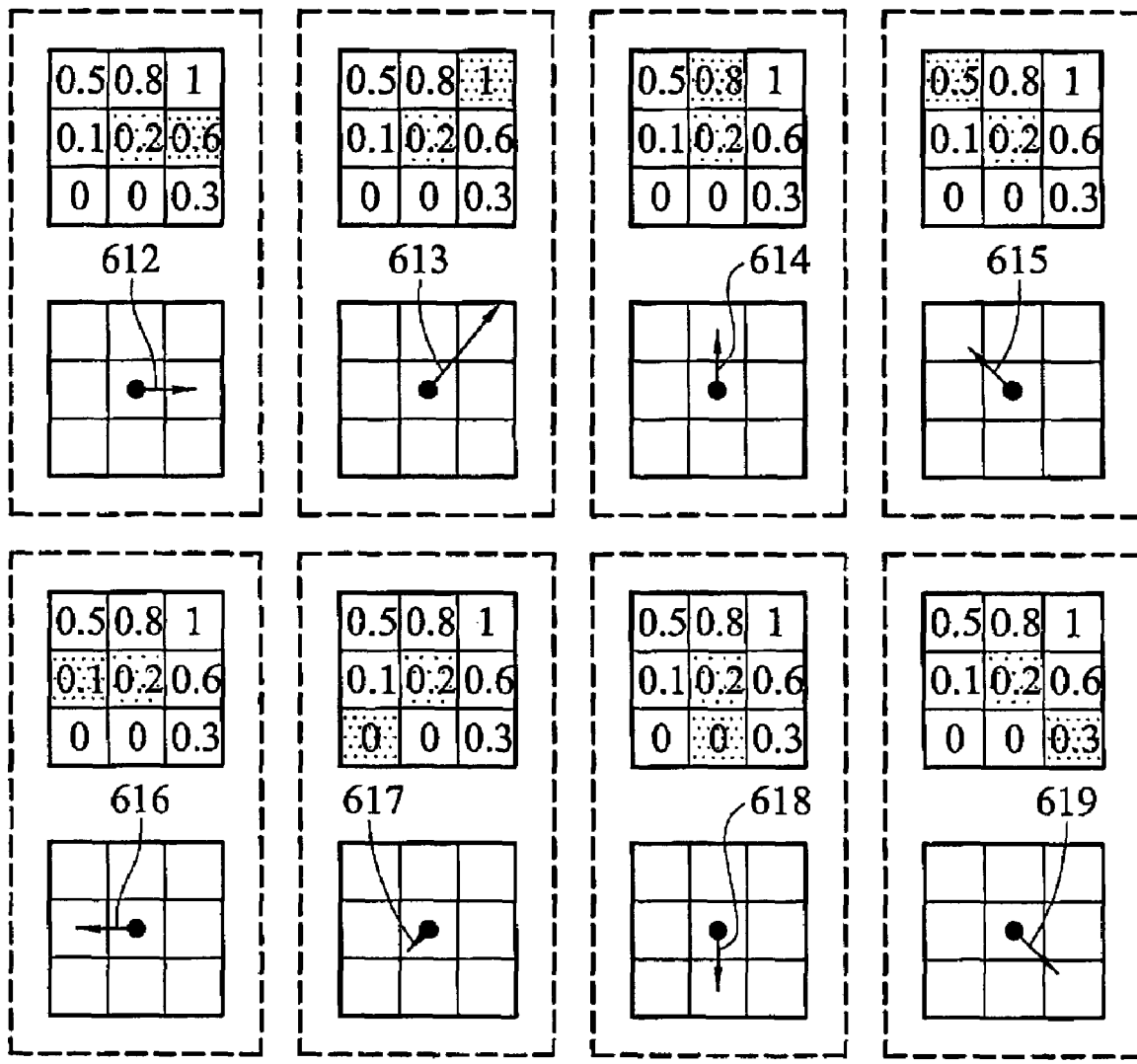

According to the second embodiment, the optical property is again intensity, and 8 pixels are referenced. In FIG. 6A, for example, pixels 61~69 form a 3×3 square, wherein pixel 61 is a primary pixel located on the preliminary contour. FIG. 6B illustrates intensity values for pixels 61~69, respectively. The pixel 61 has a center point 61a, acting as an anchor point of the preliminary contour. A modification vector is used to adjust position of the center point 61a. The modification vector is determined according to intensity values of pixels 62~69. First, differences between intensity values of pixel 61 and pixels 62~69 are calculated, respectively. The calculated difference is assigned as magnitude of the corresponding first modification vector. For example, the first modification vector 612, corresponds to pixel 62, with a magnitude of 0.4, obtained by subtracting intensity value of pixel 61 (0.2) from intensity value of pixel 62 (0.6). The direction of the first modification vector 612 is defined by an arrow form center point of pixel 61 to a center point of pixel 62, as shown in FIG. 6C. The first modification vectors 613~619 corresponding to pixels 63~69 are determined as above, as illustrated in FIG. 6C.

The first modification vectors corresponding to pixels 62~69 are further adjusted by three coefficients comprising a local gradient coefficient k1, a diagonal coefficient k2, and a boundary shifting coefficient k3. The local gradient coefficient k1 and boundary shifting coefficient k3 are flexible and determined according to quality and condition of corresponding original image.

Diagonal coefficient k2 is fixed as a length ratio between edge and diagonal of a pixel. According to the embodiment, diagonal coefficient k2 is $$\left(\frac{1}{\sqrt{2}}\right).$$

The first modification vectors corresponding to pixels 62, 64, 66, and 68 are modified using diagonal coefficient k2 to generate corresponding modification vectors. For example, the first modification vector corresponding to pixel 63 is adjusted as $$\frac{(1.0-0.2)}{\sqrt{2}}.$$

The second modification vectors for pixels 63, 65, 67, and 69 are then further adjusted using k1 and k3.

Figure 7A:
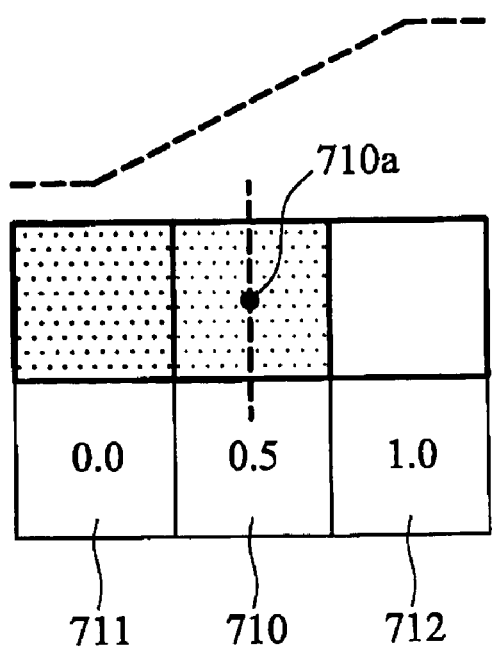
FIGS. 7A and 7B illustrate a schematic view of the local gradient coefficient according to the third embodiment of the present invention.
Figure 7B:
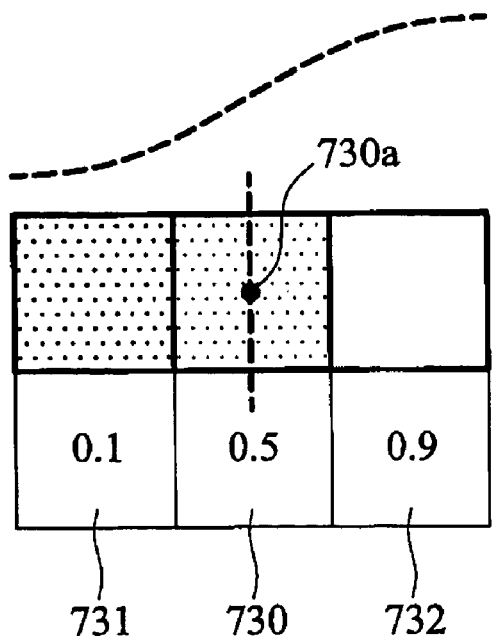

The local gradient coefficient k1 is used to adjust different intensity gradients across different areas. Referring to FIGS. 7A and 7B as an example, two areas having different intensity gradients correspond to anchor points 710*a* and 730*a* situated in the middle thereof, respectively. As shown in FIG. 7A, the intensity gradient across pixels 711 to 712 is 0.5, obtained by dividing the altitude (1−0=1) with the distance (2 pixels). Similarly, the intensity gradient across pixels 731 to 732 is 0.4, obtained by dividing the altitude (0.9−0.1=0.8) by the distance (2 pixels). The local gradient varies for different position of the image, local gradient coefficient k1 is used to normalize images with different local gradients. Using pixels 61 and 62 as an example, the local gradient thereof is normalized using a standard gradient. According to this embodiment, a standard gradient is assigned as 0.5, and the local gradient across pixels 61 and 62 is 0.4. A ratio of actual local gradient to standard gradient is first calculated to be 4 to 5. According to this embodiment, the actual local gradient equals the second modification vector. The calculated ratio is then multiplied by k1 to generate a third modification vector, determined experimentally according to the resolution, contrast, or quality of the original image. Similarly, local gradients between 61 and 63~69 are normalized and adjusted according to the aforementioned method.

Figure 8A:
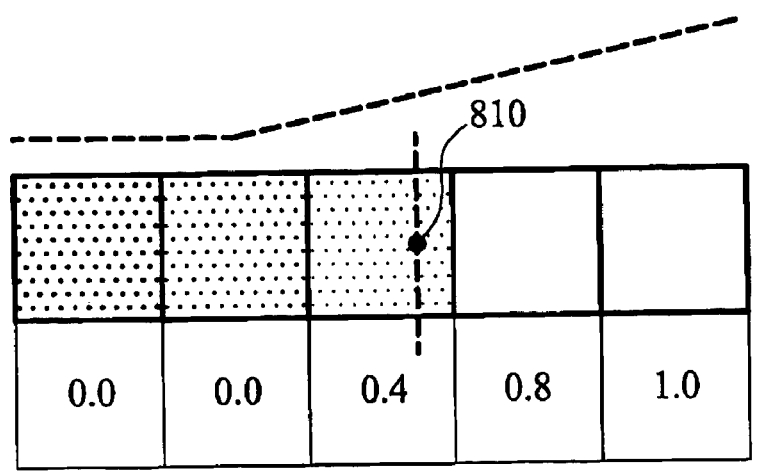
FIGS. 8A~8C illustrate a schematic view of the boundary shifting coefficient according to the third embodiment of the present invention.
Figure 8B:
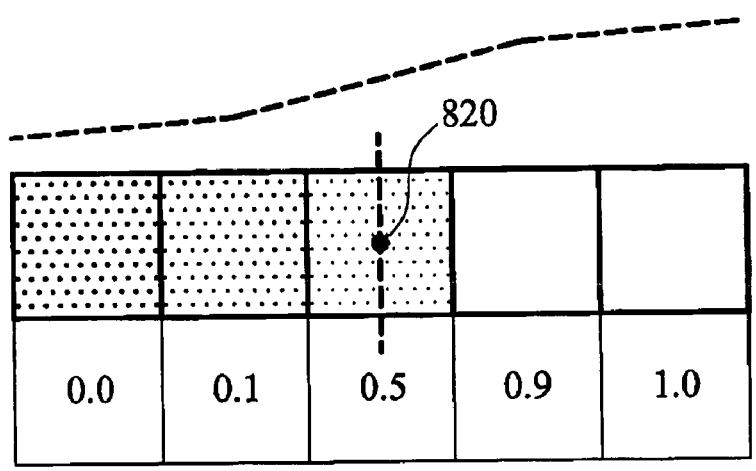
Figure 8C:
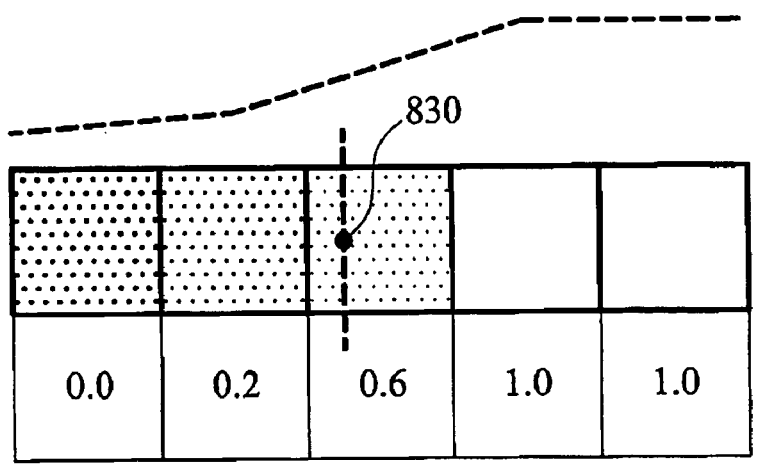

The boundary shifting coefficient k3 is used to adjust shifted edge boundary. Referring to FIGS. 8A~8C, for example, three local areas with the same intensity gradient correspond to different edge boundaries, specified by dotted lines 810, 820, and 830, respectively. The third modification vectors corresponding to pixels 62~69 are multiplied by k3 to compensate the shifted edge boundary, respectively. The boundary shifting coefficient k3 is determined experimentally according to the resolution, contrast, or quality of the original image. The adjusted third modification vectors corresponding to pixels 62~69 are added to generate a final modification vector. The final modification vector is then applied to the anchor point of primary pixel 61 to adjust its position. Selected points on the preliminary contour are adjusted in the same way as pixel 61 and the final contour is presented by the aforementioned method.

In one embodiment, an information processing method provides information for pixels in an image corresponding to an object, wherein the information specifies a measurement reading, wherein the measurement reading is the number of reflective particles from the observed object. The method determines an image of preliminary contour of the object based on the information and assigns primary and reference pixels, for each primary pixel, determining a corresponding anchor point of the primary pixel located on the preliminary contour of the object, wherein the reference pixel(s) is(/are) adjacent to the primary pixel, and the anchor point is the center of the primary pixel. The method further determines modification vector according to the information corresponding to the primary and reference pixel(s), and adjusts the position of the anchor point according to the modification vector to obtain the final contour.

The methods and system of the present invention, or certain aspects or portions thereof, may take the form of program code (i.e., instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing embodiments of the invention. When implemented on a general-purpose processor, the program code combines with the processor to provide a unique apparatus that operates analogously to specific logic circuits.

Figure 9:
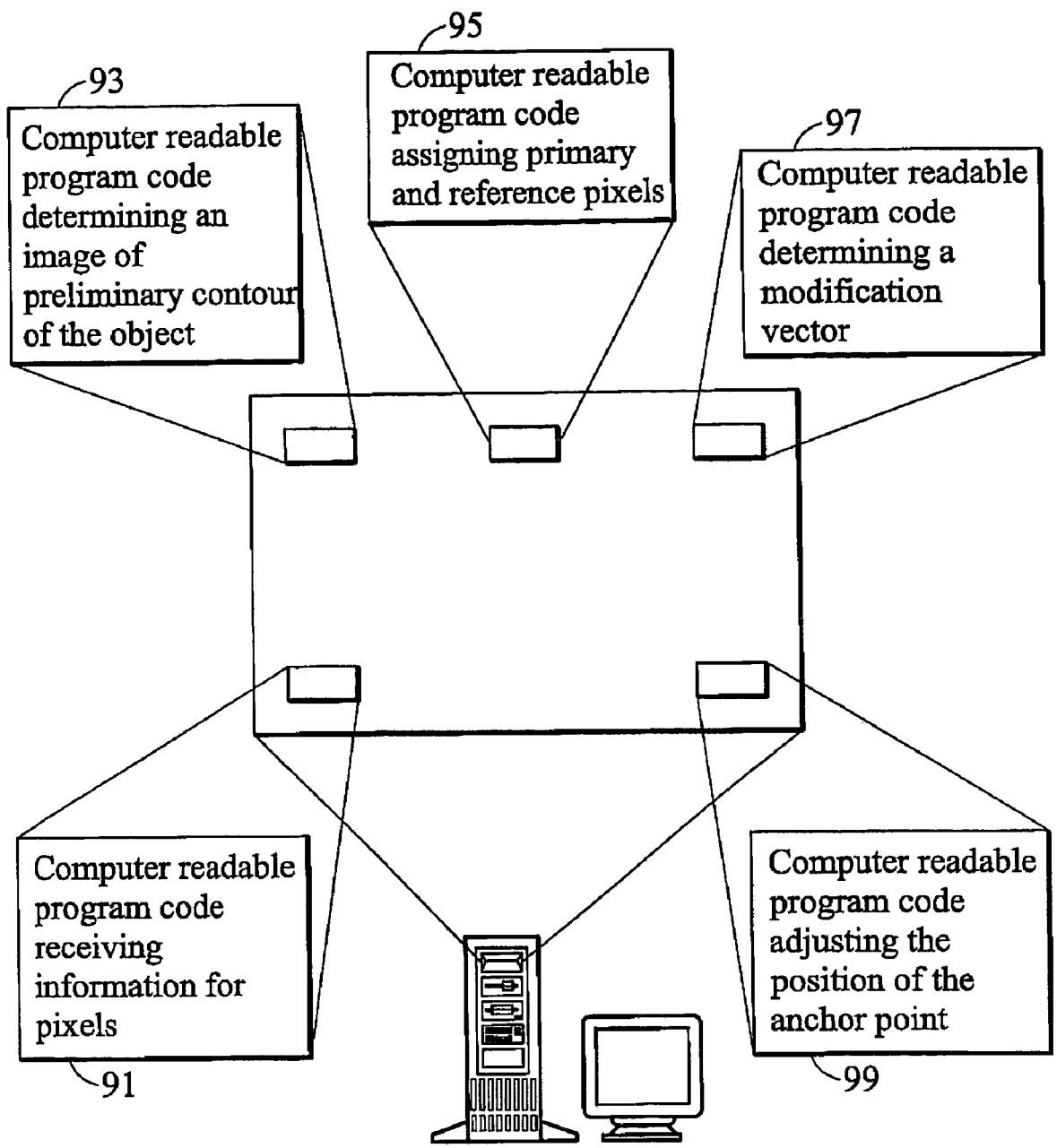
FIG. 9 is a diagram of a storage medium storing a computer program providing the image processing method according to embodiments of the present invention.

FIG. 9 is a diagram of an embodiment of a storage medium storing a computer program providing the information processing method according to the disclosure. The computer program system comprises a computer usable storage medium having computer readable program code embodied in the medium, comprising computer readable program code 91 receiving information for pixels, a computer readable program code 93 determining an image of preliminary contour of the object based on the information, a computer readable program code 95 assigning primary and reference pixels from the image of the preliminary contour, a computer readable program code 97 determining a modification vector according to the information corresponding to each primary pixel with its reference pixels, and a computer readable program code 99 adjusting the position of the anchor point according to the modification vector.

While the invention has been described by way of example and in terms of the preferred embodiments, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An information processing method, comprising: providing information for pixels in an image corresponding to an object, wherein the information
  specifies a measurement reading;
  determining an image of preliminary contour of the object based on the information;
  assigning primary and reference pixels;
  wherein for each primary pixel, determining a corresponding anchor point of the primary pixel located on the preliminary contour of the object, wherein the reference pixels are adjacent to the primary pixel; and the anchor point is the center of the primary pixel;

determining a modification vector according to the information corresponding to the primary and reference pixels; and adjusting the position of the anchor point according to the modification vector to obtain the final contour.

2. The method of claim 1, wherein the measurement reading is the intensity of the signal.

3. The method of claim 1, wherein the measurement reading is the phase of the signal.

4. The method of claim 1, wherein the measurement reading is the polarization of the signal.

5. The method of claim 1, wherein the measurement reading is the number of reflective particles from the observed object.

6. The method of claim 1, wherein the measurement reading is the altitude from the observed object.

7. The method of claim 1, wherein the preliminary contour determination performs local threshold filtering.

8. The method of claim 1, wherein the preliminary contour determination performs global threshold filtering.

9. The method of claim 8, wherein the global threshold filtering uses a fixed global threshold.

10. The method of claim 9, wherein the global threshold filtering uses a floating global threshold.

11. The method of claim 1, wherein the primary pixel corresponds to a reference pixel.

12. The method of claim 1, wherein the primary pixel corresponds to 2 reference pixels.

13. The method of claim 1, wherein the primary pixel corresponds to 8 surrounding reference pixels.

14. The method of claim 1, further determining a local gradient coefficient adjusting the modification vector.

15. The method of claim 1, further determining a diagonal coefficient adjusting the modification vector.

16. The method of claim 1, further determining a boundary shifting coefficient adjusting the modification vector.

17. An information processing system, comprising: an input/output device receiving information for pixels in an image corresponding to an object, wherein the information specifies a measurement reading;

and a processor determining an image of preliminary contour of the object based on the information;

assigning primary and reference pixels from the image;

wherein for each primary pixel, determining a corresponding anchor point of the primary pixel located on the preliminary contour of the object, wherein the reference pixels are adjacent to the primary pixel; and the anchor point is the center of the primary pixel;

determining a modification vector according to the information corresponding to the primary and reference pixels; and adjusting the position of the anchor point according to the modification vector to obtain the final contour.

18. The system of claim 17, wherein the measurement reading is the intensity of the signal.

19. The system of claim 17, wherein the measurement reading is the phase of the signal.

20. The system of claim 17, wherein the measurement reading is the polarization of the signal.

21. The method of claim 17, wherein the measurement reading is the number of reflective particles from the observed object.

22. The method of claim 17, wherein the measurement reading is the altitude from the observed object.

23. The system of claim 17, wherein the processor further performs local threshold filtering to determine the image of preliminary contour.

24. The system of claim 17, wherein the processor further performs global threshold filtering to determine the image of preliminary contour.

25. The system of claim 24, wherein the global threshold filtering uses a fixed global threshold.

26. The system of claim 24, wherein the global threshold filtering uses a floating global threshold.

27. The system of claim 17, wherein the primary pixel corresponds to 1 reference pixel.

28. The system of claim 17, wherein the primary pixel corresponds to 2 reference pixels.

29. The system of claim 17, wherein the primary pixel corresponds to 8 surrounding reference pixels.

30. The system of claim 17, wherein the processor further determines a local gradient coefficient adjusting the modification vector.

31. The system of claim 17, wherein the processor further determining a diagonal coefficient adjusting the modification vector.

32. The system of claim 17, wherein the processor further determining a boundary shifting coefficient adjusting the modification vector.

33. A computer readable medium for storing a computer program providing an image processing method, the method comprising:

receiving information for pixels in an image corresponding to an object, wherein the information specifies a measurement reading;

determining an image of preliminary contour of the object based on the information;

assigning primary and reference pixels from the image;

wherein for each primary pixel, determining a corresponding anchor point of the primary pixel located on the preliminary contour of the object, wherein the reference pixels are adjacent to the primary pixel; and the anchor point is the center of the primary pixel;

determining a modification vector according to the information corresponding to the primary and reference pixels; and adjusting the position of the anchor point according to the modification vector to obtain the final contour.

34. The computer readable storage medium of claim 33, wherein the method further determines a local gradient coefficient adjusting the modification vector.

35. The computer readable storage medium of claim 33, wherein the method further determines a diagonal coefficient adjusting the modification vector.

36. The computer readable storage medium of claim 33, wherein the method further determines a boundary shifting coefficient adjusting the modification vector.

* * * * *